US008643592B2

(12) United States Patent
Yoon et al.

(10) Patent No.: US 8,643,592 B2

(45) Date of Patent: Feb. 4, 2014

(54) LIGHT SENSING CIRCUIT, BACKLIGHT CONTROL APPARATUS HAVING THE SAME, AND LIQUID CRYSTAL DISPLAY DEVICE HAVING THE SAME

(75) Inventors: Jeong-Won Yoon, Seoul (KR); Su-Hwan Moon, Gumi (KR)

(73) Assignee: LG Display Co., Ltd., Seoul (KR)

( * ) Notice: Subject to any disclaimer, the term of this patent is extended or adjusted under 35 U.S.C. 154(b) by 160 days.

(21) Appl. No.: 13/104,441

(22) Filed: May 10, 2011

(65) Prior Publication Data

US 2011/0234559 A1 Sep. 29, 2011

Related U.S. Application Data

(62) Division of application No. 11/646,715, filed on Dec. 28, 2006, now Pat. No. 7,804,481, and a division of application No. 12/870,648, filed on Aug. 27, 2010, now Pat. No. 7,961,181.

(30) Foreign Application Priority Data

Jun. 23, 2006 (KR) ................................ 2006-57131

(51) Int. Cl.
*H01L 31/0376* (2006.01)

(52) U.S. Cl.
USPC ............ 345/102; 345/207; 257/225; 250/200

(58) Field of Classification Search
USPC .................................................. 345/102, 207
See application file for complete search history.

(56) References Cited

U.S. PATENT DOCUMENTS

| | | | | |
|---|---|---|---|---|
| 5,532,718 | A | 7/1996 | Ishimaru | |
| 5,600,400 | A | 2/1997 | Wakabayashi et al. | |
| 5,627,457 | A | 5/1997 | Ishiyama et al. | |
| 5,854,617 | A | 12/1998 | Lee et al. | |
| 6,160,534 | A | 12/2000 | Katakura | |
| 6,300,926 | B1 | 10/2001 | Yoneya et al. | |
| 6,359,391 | B1 * | 3/2002 | Li | 315/291 |
| 6,809,718 | B2 | 10/2004 | Wei et al. | |
| 6,816,139 | B2 | 11/2004 | Park | |
| 6,930,518 | B2 | 8/2005 | Kim et al. | |
| 7,208,718 | B2 | 4/2007 | Park et al. | |

(Continued)

FOREIGN PATENT DOCUMENTS

| | | |
|---|---|---|
| EP | 588529 | 3/1994 |
| KR | 2003-0075317 | 9/2003 |

OTHER PUBLICATIONS

Office Action issued in corresponding Korean Patent Application No. 10-2006-0057131; issued Oct. 30, 2009.

*Primary Examiner* — Alexander S Beck
*Assistant Examiner* — Jeffrey Steinberg
(74) *Attorney, Agent, or Firm* — Brinks Gilson & Lione

(57) ABSTRACT

A light sensing circuit capable of enhancing a reliability by lowering a dependency on a temperature change without using a resistor, a backlight control apparatus having the same, and an LCD device having the same. The light sensing circuit includes a first MOS-transistor; and a second MOS-transistor serially connected to the first MOS-transistor between a first power terminal and a ground terminal, in which a second power terminal is connected to each gate terminal of the first MOS-transistor and the second MOS-transistor, and an optical amount detecting terminal is connected to a common connection point between a drain terminal of the first MOS-transistor and a source terminal of the second MOS-transistor.

8 Claims, 2 Drawing Sheets

(56) References Cited

U.S. PATENT DOCUMENTS

| | | | | |
|---|---|---|---|---|
| 7,242,384 | B2 | 7/2007 | Yamamoto et al. | |
| 7,245,284 | B2 | 7/2007 | Iwasaki | |
| 7,362,390 | B2 | 4/2008 | Lai | |
| 7,804,481 | B2 * | 9/2010 | Yoon et al. | 345/102 |
| 7,893,932 | B2 * | 2/2011 | Kobashi | 345/207 |
| 7,961,181 | B2 * | 6/2011 | Yoon et al. | 345/207 |
| 2005/0259064 | A1 * | 11/2005 | Sugino et al. | 345/102 |
| 2007/0080956 | A1 | 4/2007 | Fann | |
| 2008/0158137 | A1 | 7/2008 | Yoshida | |
| 2008/0284719 | A1 * | 11/2008 | Yoshida | 345/102 |

* cited by examiner

LIGHT SENSING CIRCUIT, BACKLIGHT CONTROL APPARATUS HAVING THE SAME, AND LIQUID CRYSTAL DISPLAY DEVICE HAVING THE SAME

The present patent document is a divisional of U.S. patent application Ser. No. 12/870,648, filed Aug. 27, 2010, which is a divisional of U.S. patent application Ser. No. 11/646,715, filed Dec. 28, 2006, which claims priority to Korean Patent Application No. 57131/2006 filed in Korea on Jun. 23, 2006, which is hereby incorporated by reference.

BACKGROUND

1. Field of the Invention

The present invention relates to a light sensing circuit capable of measuring an optical amount, a backlight control apparatus having the same, and a liquid crystal display (LCD) device having the same, and more particularly, to a light sensing circuit capable of lowering a dependency on a temperature change without using a resistor, a backlight control apparatus having the same, and an LCD device having the same.

2. Discussion of the Related Art

Generally, an LCD device serves to display a desired image by controlling an amount of light that passes through a liquid crystal layer by controlling an arrangement of a liquid crystal molecule having a refractivity anisotropy using an electric field.

The LCD device consists of an LC panel, and a backlight positioned at a rear side of the LC panel for irradiating light into the LC panel. The LC panel for substantially forming an image includes a lower substrate, an upper substrate, and an LC layer positioned therebetween. The lower substrate is a thin film transistor (TFT) substrate on which a TFT and a pixel electrode are formed. The upper substrate is a color filter substrate on which a black matrix (BM), a color filter layer, and a common electrode are formed. A polarizer is attached onto an outer surface of the TFT substrate and the color filter substrate. A driving circuit portion is provided at an edge of the lower substrate, thereby respectively supplying a signal to the TFT, the pixel electrode, and the common electrode formed at the lower substrate.

The backlight includes a lamp for substantially emitting light, a reflection plate for enhancing an optical efficiency by reflecting light emitted from the lamp, and an optical sheet for uniformly introducing light emitted from the lamp into the LC panel.

In the conventional LCD device, the backlight may not generate a high brightness at a dark place. However, the conventional backlight has been constructed so as to maintain a brightness constant regardless of a peripheral brightness, thereby wasting power.

To solve the problem, a technique for detecting a peripheral brightness of the LCD device and controlling an optical amount according to the detected brightness has been proposed.

FIG. 1 is a circuit diagram showing a light sensing circuit for an LCD device in accordance with the related art. As shown, the light sensing circuit includes a MOS-transistor TFT 11 installed in the LC panel, for detecting an optical amount thereby generating a voltage based on the detection result; and a resistor R 11 connected between a source terminal and a ground terminal of the MOS-transistor TFT 11, for sensing an optical amount by the MOS-transistor TFT11. An operation of the light sensing circuit will be explained.

The MOS-transistor TFT 11, an amorphous-silicon type TFT is installed in the LC panel. The MOS-transistor TFT 11 includes a gate, and source/drain separated from each other based on the gate. A voltage (VH) is supplied to the source, and a bias voltage (VL) is supplied to the gate. The drain of the MOS-transistor TFT 11 is connected to the ground terminal through the resistor R 11.

A current of the amorphous-silicon type TFT becomes different according to an optical amount. When an amount of irradiated light is large, a current intensity is increased. That is, when an amount of light irradiated into the MOS-transistor TFT11 is increased, a voltage output through the drain is increased.

An inverter driving controller (not shown) detects change of a voltage output from the MOS-transistor TFT 11 by an optical amount detecting terminal (Vd) connected between the drain and the resistor R 11 of the MOS-transistor TFT11. Then, the inverter driving controller detects a peripheral brightness of the LCD device, thereby controlling a brightness of the backlight. For instance, when the peripheral brightness of the LCD device is dark, the brightness of the backlight is lowered thus to operate the backlight in a saving mode.

However, the MOS-transistor TFT 11 and the resistor R 11 are influenced by temperature. When the MOS-transistor TFT 11 and the resistor R 11 are operated in different temperatures, an optical amount variation is not precisely detected. Furthermore, the MOS-transistor TFT11 disposed in the LC panel and the resistor R 11 disposed at the driving circuit portion are influenced by different temperatures. Accordingly, an optical amount variation is not precisely detected thus to lower a reliability of the light sensing circuit.

BRIEF SUMMARY

Therefore, the present disclosure provides a light sensing circuit capable of precisely detecting an optical amount variation regardless of a peripheral temperature variation of an LCD device.

An LCD device having the light sensing circuit capable of precisely detecting an optical amount variation regardless of a peripheral temperature variation of the LCD device is also disclosed.

A backlight driving controlling apparatus is disclosed that is capable of controlling a driving of a backlight according to an optical amount variation detected by a light sensing circuit for detecting an optical amount variation regardless of a peripheral temperature variation of the LCD device.

A light sensing circuit includes a first MOS-transistor and a second MOS-transistor serially connected to each other between a first power terminal and a ground terminal, in which a second power terminal is connected to each gate terminal of the first MOS-transistor and the second MOS-transistor, and an optical amount detecting terminal is connected to a common connection point between a drain terminal of the first MOS-transistor and a source terminal of the second MOS-transistor.

A liquid crystal display (LCD) device is also disclosed that includes an LC panel; a backlight for irradiating light into a rear side of the LC panel; an inverter for supplying an output power to the backlight; a light sensing circuit for detecting an amount of external light introduced to the LC panel by a first MOS-transistor and a second MOS-transistor serially connected to each other; and an inverter driving controller for controlling a driving of an inverter according to the detected voltage from the light sensing circuit.

A backlight control apparatus for controlling a backlight to irradiate light to a rear side of an LC panel, the apparatus includes a light sensing circuit for detecting an amount of external light introduced into the LC panel by a first MOS-transistor and a second MOS-transistor serially connected to each other, and outputting a voltage corresponding to the optical amount according to the detected optical amount; an inverter for supplying an output power to the backlight; and an inverter driving controller for controlling a driving of the inverter according to the detected voltage from the light sensing circuit.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE DRAWINGS AND THE PRESENTLY PREFERRED EMBODIMENTS

Reference will now be made in detail to the preferred embodiments of the present invention, examples of which are illustrated in the accompanying drawings.

Figure 1:
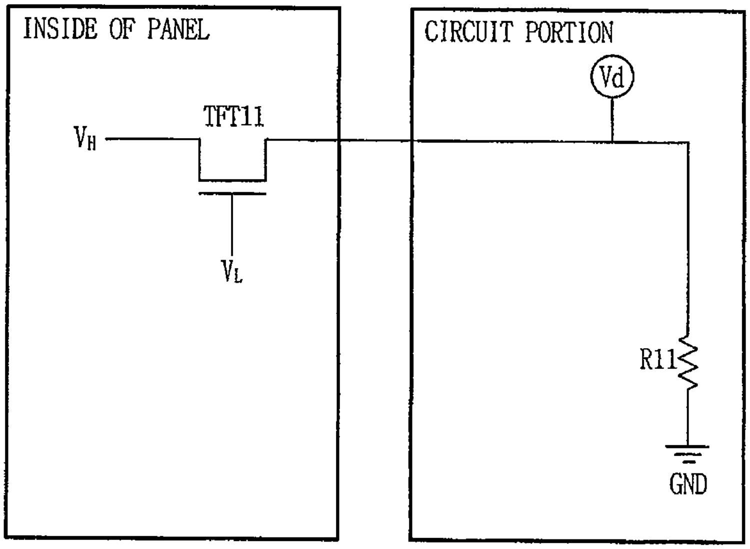
FIG. 1 RELATED ART
FIG. 1 is a circuit diagram showing a light sensing circuit for an LCD device in accordance with the related art.
Figure 2:
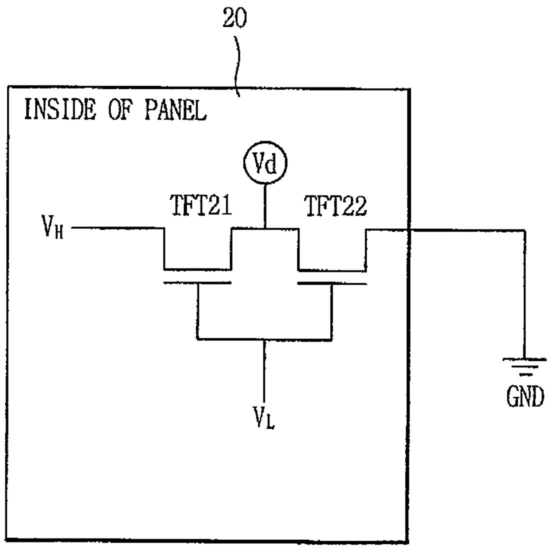
FIG. 2 is a circuit diagram showing a light sensing circuit for an LCD device.

FIG. 2 is a circuit diagram showing a light sensing circuit for an LCD device. As shown, a light sensing circuit 20 comprises a first MOS-transistor and a second MOS-transistor serially connected to each other between a first power terminal ($V_H$) and a ground terminal (GND), in which a second power terminal ($V_L$) is connected to each gate terminal of the first MOS-transistor and the second MOS-transistor, and an optical amount detecting terminal ($V_d$) is connected to a common connection point between a drain terminal of the first MOS-transistor and a source terminal of the second MOS-transistor.

Figure 3:
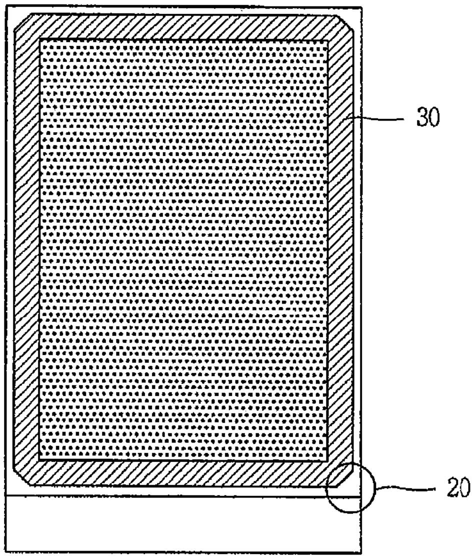
FIG. 3 is a plane view schematically showing an LCD device for explaining an installation position of the light sensing circuit.

The light sensing circuit 20 will be explained in more detail with reference to FIGS. 2 and 3.

As shown in FIG. 2, in the light sensing circuit 20, an amorphous-silicon type (a-Si) first MOS-transistor TFT21 is connected to a second MOS-transistor TFT22 in serial. A source terminal of the first MOS-transistor TFT21 is serially connected to a first power terminal $V_H$, and a drain terminal of the second MOS-transistor TFT22 is serially connected to a ground terminal GND. That is, the first MOS-transistor TFT21 and the second MOS-transistor TFT22 are serially connected to each other between the first power terminal $V_H$ and the ground terminal GND. A second power terminal $V_L$ is connected to each gate terminal of the first MOS-transistor TFT21 and the second MOS-transistor TFT22, and an optical amount detecting terminal $V_d$ is connected to a common connection point between a drain terminal of the first MOS-transistor TFT21 and a source terminal of the second MOS-transistor TFT22. The first power terminal $V_H$ has a power greater than that of the second power terminal $V_L$.

Preferably, the light sensing circuit 20 composed of the first MOS-transistor TFT21 and the second MOS-transistor TFT22 is installed on a liquid crystal panel 30 at a position where external light can be easily sensed. As shown in FIG. 3, the light sensing circuit 20 may be installed at an edge of the LC panel 30.

The first MOS-transistor TFT21 is installed so as to be exposed to external light, and the second MOS-transistor TFT22 is installed at a position corresponding to a black matrix BM so as to shield external light. That is, in order to use the first MOS-transistor TFT21 as a substantial optical sensor, a black matrix corresponding to the first MOS-transistor TFT21 is removed so that external light can be introduced to the first MOS-transistor TFT21. Also, to use the second MOS-transistor TFT22 as the conventional resistor for detecting a voltage change, the second MOS-transistor TFT22 is covered by a black matrix BM so that external light can not be introduced thereto. The first MOS-transistor TFT21 and the second MOS-transistor TFT22 are formed on the lower substrate by the same process except whether or not external light is shielded by a black matrix disposed on the upper substrate. Although not shown, a polarizer is preferably removed at a position corresponding to the first MOS-transistor TFT22 used as an optical sensor. When the polarizer covers the first MOS-transistor TFT22, a photo-sensitivity of the first MOS-transistor TFT22 for external light is reduced.

When a brightness of external light introduced onto the LC panel 30 is constant, an output voltage from the optical amount detecting terminal $V_d$ has a constant value. However, when the brightness of external light introduced onto the LC panel 30 is changed, the output voltage from the optical amount detecting terminal $V_d$ is changed in correspondence with the optical amount. For instance, when it becomes dark, an amount of light introduced to the first MOS-transistor TFT21 is decreased thus to output a small voltage from the drain terminal of the first MOS-transistor TFT21. Accordingly, an output voltage from the optical amount detecting terminal $V_d$ is lowered.

The inverter driving controller determines a peripheral brightness of the LCD device based on the output voltage from the optical amount detecting terminal $V_d$, thereby controlling a brightness of the backlight.

The first MOS-transistor TFT21 and the second MOS-transistor TFT22 are positioned in the LC panel, and are formed of the same material with the same structure. Accordingly, even if a temperature condition of the first MOS-transistor TFT21 and the second MOS-transistor TFT2 is changed, a change degree of the first MOS-transistor TFT21 and the second MOS-transistor TFT22 is equal to each other thus to obtain a reliability of the first MOS-transistor TFT21 and the second MOS-transistor TFT22. That is, a dependency of the first MOS-transistor TFT21 and the second MOS-transistor TFT22 on the temperature change is lowered, and the first MOS-transistor TFT21 and the second MOS-transistor TFT22 can more precisely detect an amount of external light regardless of temperature change.

Figure 4:
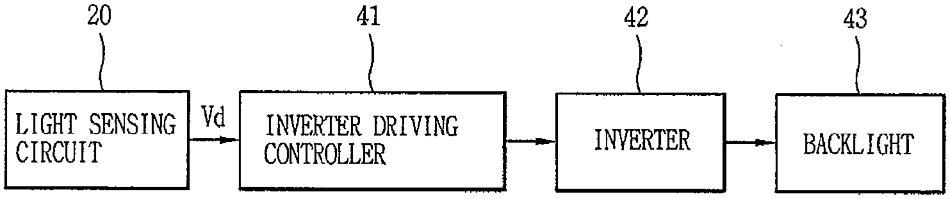
FIG. 4 is a block diagram showing a backlight control apparatus using the light sensing circuit.

Hereinafter, a backlight control apparatus for an LCD device having the light sensing circuit according to the present invention will be explained with reference to FIG. 4. FIG. 4 is a block diagram showing a backlight control apparatus using the light sensing circuit. As shown in FIG. 4, the backlight control apparatus for an LCD comprises a light sensing circuit 20 for detecting an amount of external light introduced to an LC panel by a first MOS-transistor and a second MOS-transistor serially connected to each other, and for outputting a voltage based on the detected optical amount; an inverter driving controller 41 for controlling a driving of an inverter 42 according to the voltage from the light sensing circuit 20; an inverter 42 for supplying an output voltage to a backlight 43 according to a control signal of the inverter driving controller 41; and a backlight 43 driven by the inverter 42 for supplying light to the LC panel.

An operation of the backlight control apparatus for an LCD device will be explained. As aforementioned, the light sensing circuit 20 in which the first MOS-transistor TFT21 and the second MOS-transistor TFT22 are serially connected to each other senses a brightness of external light, and then outputs a voltage according to the sensed brightness from the optical amount detecting terminal $V_d$.

When the external light introduced to the LC panel 30 has a constant brightness, the voltage output from the optical amount detecting terminal $V_d$ is constant.

The inverter driving controller 41 maintains a previous driving state of the inverter 42, thereby driving the backlight 43 with the previous brightness.

However, when the brightness of the external light introduced onto the LC panel 30 is changed, for instance, when it becomes dark, a voltage output from the optical amount detecting terminal $V_d$ is changed in correspondence with the optical amount (e.g., the voltage is lowered).

The inverter driving controller 41 controls an output power from the inverter 42 to be lowered by a corresponding level based on the voltage output from the optical amount detecting terminal $V_d$. Each data for the level for adjusting the output power from the inverter 42 based on the voltage output from the optical amount detecting terminal $V_d$ may be stored in the inverter driving controller 41 in the form of a table.

Accordingly, the brightness of the backlight 43 is decreased than the previous brightness. However, since the peripheral brightness is dark, a user does not have a difficulty in seeing an image on the LC panel 30. Furthermore, since an output power from the inverter 42 is lowered, a consumption power is also reduced.

As aforementioned, without using a resistor, one pair of MOS-transistors are used as an optical sensor circuit for detecting a peripheral temperature change of the LCD device. Accordingly, an optical amount change can be precisely detected regardless of the peripheral temperature change. The one pair of MOS-transistors are installed at the same position, and are formed of the same material thus to have a similar change degree against temperature. Accordingly, a dependency of the light sensing circuit on temperature is lower than the conventional light sensing circuit.

Furthermore, driving of the backlight is controlled by the light sensing circuit for sensing an optical amount change regardless of a peripheral temperature change. Accordingly, an energy saving effect is maximized within a range not influence on the user's difficulty in seeing an image on the LC panel.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalents of such metes and bounds are therefore intended to be embraced by the appended claims.

The invention claimed is:

1. A backlight control apparatus for controlling a backlight to irradiate light to a rear side of an LC panel, the apparatus comprising:

a light sensing circuit that detects an amount of external light introduced into the LC panel by a first MOS-transistor and a second MOS-transistor serially connected to each other, and outputs a voltage corresponding to the detected optical amount; an inverter that supplies an output power to a backlight; and an inverter driving controller that controls a driving of the inverter according to the voltage output from the light sensing circuit, wherein the first MOS-transistor and the second MOS-transistor are disposed in a second region so that the first MOS-transistor is exposed to external light and the second MOS-transistor is not exposed to external light.

2. The backlight control apparatus of claim 1, wherein the first MOS-transistor and the second MOS-transistor comprise an amorphous-silicon type MOS-transistor.

3. The backlight control apparatus of claim 1, wherein the first MOS-transistor is disposed so as to be exposed to external light, and the second MOS-transistor is disposed so as not to be exposed to external light.

4. The backlight control apparatus of claim 1, wherein the voltage output is varied according to the brightness at the outside of the LC panel and the output power to the backlight from the inverter is varied according to the voltage output.

5. The backlight control apparatus of claim 4, wherein the output power to the backlight is decrease when the brightness at the outside of the LC panel is decreased so that the brightness of the backlight is decreased.

6. The backlight control apparatus of claim 4, wherein the output power to the backlight is increased when the brightness at the outside of the LC panel is increased so that the brightness of the backlight is increased.

7. The backlight control apparatus of claim 1, wherein the inverter driving controller includes a table having data for a level adjusting the output power from the inverter based on the voltage output.

8. The backlight control apparatus of claim 1, wherein the first MOS-transistor and the second MOS-transistor are under the same temperature condition.

* * * * *